(12) United States Patent
Koga

(10) Patent No.: US 11,219,148 B2
(45) Date of Patent: Jan. 4, 2022

(54) PRODUCTION SYSTEM AND PRODUCTION METHOD

(71) Applicant: JUKI CORPORATION, Tama (JP)

(72) Inventor: Hiroyuki Koga, Tama (JP)

(73) Assignee: JUKI CORPORATION, Tama (JP)

(*) Notice: Subject to any disclaimer, the term of this patent is extended or adjusted under 35 U.S.C. 154(b) by 3 days.

(21) Appl. No.: 16/825,207

(22) Filed: Mar. 20, 2020

(65) Prior Publication Data
US 2020/0305317 A1 Sep. 24, 2020

(30) Foreign Application Priority Data

Mar. 22, 2019 (JP) .............................. JP2019-055123

(51) Int. Cl.
*B23P 19/00* (2006.01)
*H05K 13/04* (2006.01)
*H05K 13/08* (2006.01)

(52) U.S. Cl.
CPC ......... *H05K 13/0452* (2013.01); *H05K 13/08* (2013.01); *Y10T 29/5313* (2015.01)

(58) Field of Classification Search
CPC .. H01L 21/67144; H05K 1/0274; H05K 1/14; H05K 1/0266; H05K 1/0269; H05K 2201/09918; Y10T 29/5313; Y10T 29/4913

USPC .................. 29/729, 832, 564, 739, 742, 833
See application file for complete search history.

(56) References Cited

U.S. PATENT DOCUMENTS

| | | | | |
|---|---|---|---|---|
| 5,039,868 A | * | 8/1991 | Kobayashi | G01N 21/95684 250/559.08 |
| 5,455,870 A | * | 10/1995 | Sepai | G01N 21/95684 382/147 |

FOREIGN PATENT DOCUMENTS

JP 2006-086281 A 3/2006

* cited by examiner

*Primary Examiner* — Thiem D Phan
(74) *Attorney, Agent, or Firm* — Faegre Drinker Biddle & Reath LLP

(57) ABSTRACT

A production system includes: a substrate counter configured to count the number of substrates existing in a production line including a mounting device; a mark pattern acquisition unit configured to acquire a mark pattern indicating a pattern of a mark that is provided to each of the plurality of substrates counted by the substrate counter; a determination unit configured to determine whether the respective mark patterns of the plurality of substrates acquired by the mark pattern acquisition unit are the same as each other; and a detection controller configured to control a detection process of the mark pattern by the mounting device based upon a determination result of the determination unit.

7 Claims, 6 Drawing Sheets

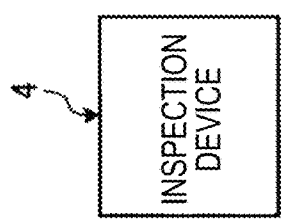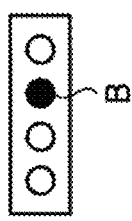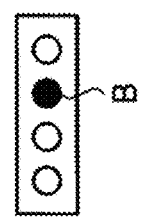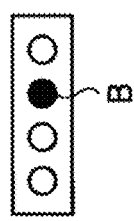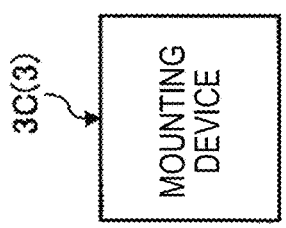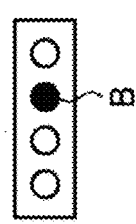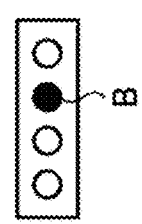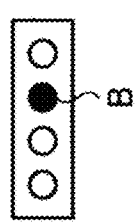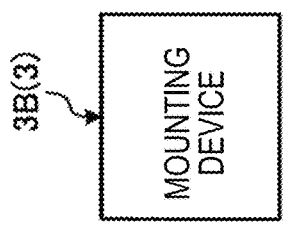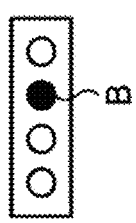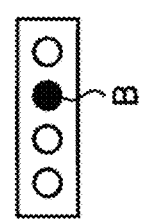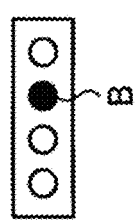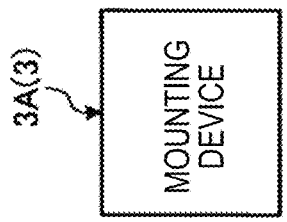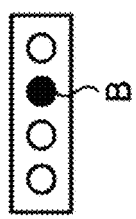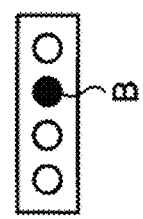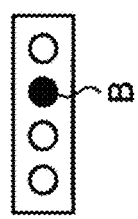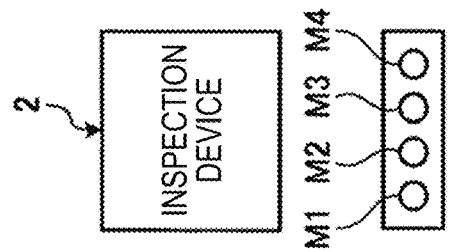
FIG.5A  FIG.5B  FIG.5C  FIG.5D

PRODUCTION SYSTEM AND PRODUCTION METHOD

CROSS-REFERENCE TO RELATED APPLICATIONS

The present application claims the benefit of priority of Japanese Patent Application No. 2019-055123, filed on Mar. 22, 2019, the content of which is incorporated herein by reference.

TECHNICAL FIELD

The present invention relates to a production system and a production method.

BACKGROUND ART

In a production system for producing an electronic device, a production line is constructed by a plurality of mounting devices. Before carrying a substrate into the production line, a process of printing cream solder on the substrate and an inspection process of inspecting a printed state of the substrate are executed. When the printed state is defective, a mark referred to as a bad mark is provided on the substrate. JP-A-2006-086281 discloses a technology in which an individual identification number is provided to the substrate and the bad mark is stored in a storage area in association with the individual identification number.

The individual identification number associated with the bad mark is provided to the substrate, whereby each of the plurality of mounting devices can recognize the printed state of the substrate by recognizing the individual identification number.

When the individual identification number is not provided to the substrate, each of the plurality of mounting devices is required to detect the bad mark in order to recognize the printed state of the substrate. When the plurality of mounting devices individually detect the bad mark, the detection of the bad mark may be unnecessarily executed. When the detection of the bad mark is unnecessarily executed, the productivity of the electronic device may deteriorate.

SUMMARY OF INVENTION

A first aspect of the present invention is a production system, including: a substrate counter configured to count the number of substrates existing in a production line including a mounting device; a mark pattern acquisition unit configured to acquire a mark pattern indicating a pattern of a mark that is provided to each of the plurality of substrates counted by the substrate counter; a determination unit configured to determine whether the respective mark patterns of the plurality of substrates acquired by the mark pattern acquisition unit are the same as each other; and a detection controller configured to control a detection process of the mark pattern by the mounting device based upon a determination result of the determination unit.

A second aspect of the present invention is a production method, including: counting the number of substrates existing in a production line including a mounting device; acquiring a mark pattern indicating a pattern of a mark that is provided to each of the plurality of counted substrates; determining whether the respective acquired mark patterns of the plurality of substrates are the same as each other; and controlling a detection process of the mark pattern by the mounting device based upon a determination result.

According to the respective aspects of the present invention, it is possible to prevent deterioration in productivity of an electronic device.

BRIEF DESCRIPTION OF DRAWINGS

FIGS. 5A to 5D are diagrams illustrating an operation of the production system.

DESCRIPTION OF EMBODIMENTS

Hereinafter, embodiments of the present invention will be described with reference to the drawings, and the present invention is not limited to the embodiments described below.

Production System

Figure 1:
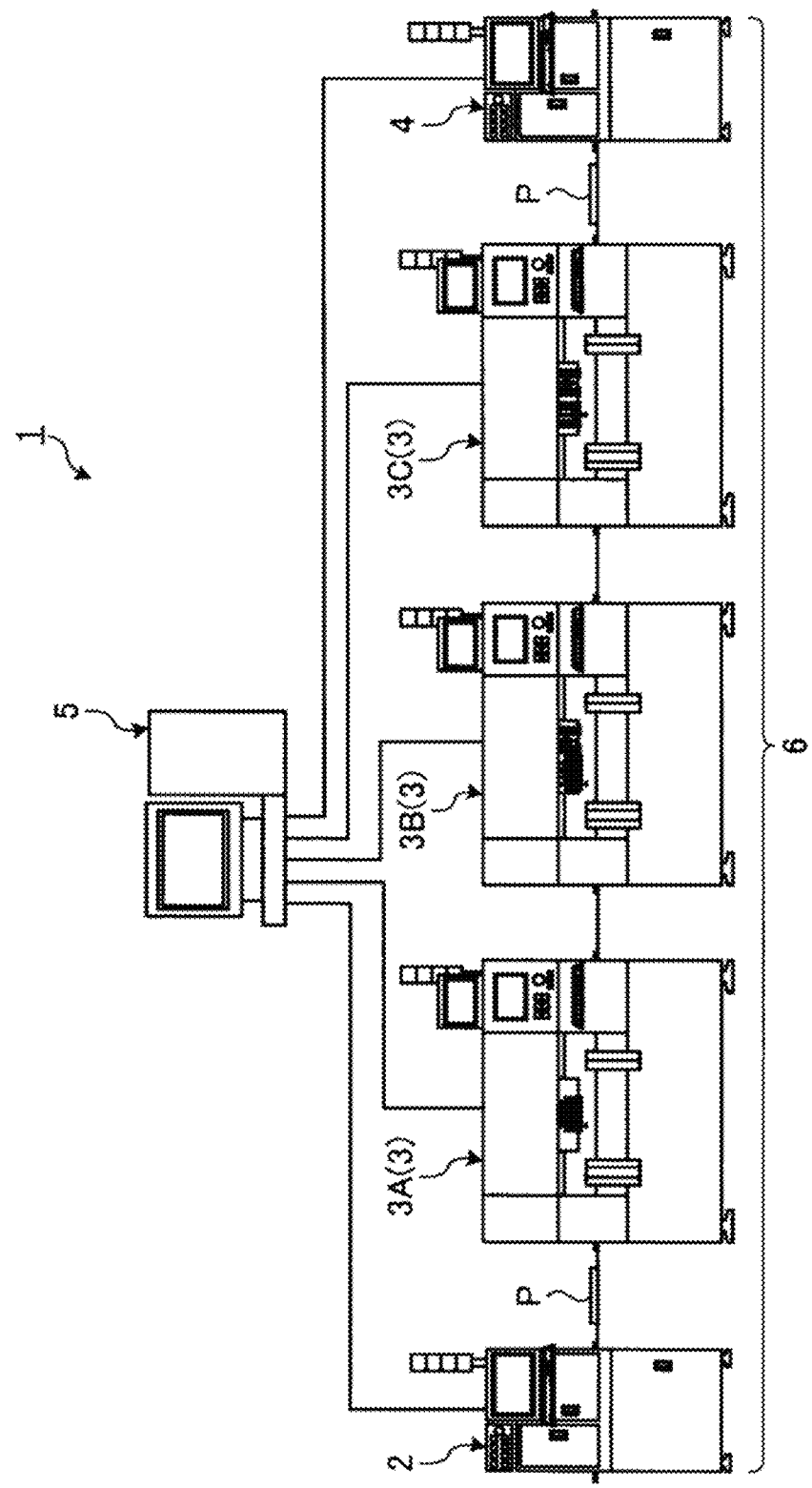
FIG. 1 is a diagram illustrating a production system according to an embodiment.

FIG. 1 is a diagram illustrating a production system 1 according to the embodiment. As illustrated in FIG. 1, the production system 1 includes an inspection device 2, a mounting device 3, an inspection device 4, and a management device 5. A production line 6 for an electronic device is constructed by the inspection device 2, the mounting device 3, and the inspection device 4.

In the production line 6, a plurality of mounting devices 3 are provided. In the embodiment, the mounting device 3 includes a first mounting device 3A, a second mounting device 3B, and a third mounting device 3C.

A substrate P is conveyed in the production line 6. The electronic device is produced by conveying the substrate P in the production line 6. In the embodiment, a leading device of the production line 6 is the inspection device 2. A tail device of the production line 6 is the inspection device 4. After being carried into the inspection device 2, the substrate P is sequentially conveyed to each of the plurality of mounting devices 3 (3A, 3B, and 3C). The plurality of mounting devices 3 (3A, 3B, and 3C) sequentially mount an electronic component C on the substrate P. The substrate P on which the electronic component C is mounted in the mounting device 3 is carried out from the inspection device 4.

Before the substrate P is carried into the production line 6, cream solder is printed on the substrate P by a printing machine. The substrate P on which the cream solder is printed is carried into the inspection device 2. The illustration of the printing machine is omitted.

The inspection device 2 includes a solder paste inspection (SPI) device for inspecting a printed state of the substrate P before the electronic component C is mounted. The inspection device 2 provides a mark pattern MP to the substrate P based upon an inspection result of the printed state of the substrate P.

The mounting device 3 mounts the electronic component C on the substrate P on which the cream solder is printed. The substrate P on which the electronic component C is mounted is heated in a reflow furnace. The substrate P is heated in the reflow furnace, whereby the cream solder is melted. The melted cream solder is cooled, whereby the electronic component C is soldered to the substrate P. The illustration of the reflow furnace is omitted.

The inspection device 4 includes a substrate appearance inspection device (automated optical inspection (AOI) for inspecting the state of the substrate P after the electronic component C is mounted.

The management device 5 includes a computer system. The management device 5 controls the production line 6.

Mounting Device

Figure 2:
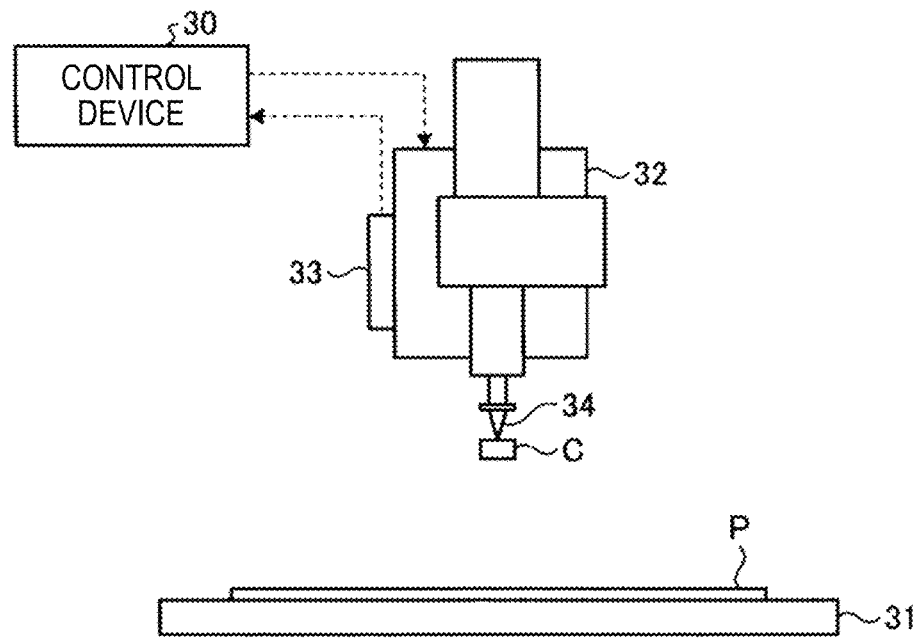
FIG. 2 is a diagram illustrating a mounting device according to the embodiment.

FIG. 2 is a diagram illustrating the mounting device 3 according to the embodiment. The mounting device 3 includes: a control device 30; a substrate support member 31 for supporting the substrate P; a mounting head 32 for mounting the electronic component C on the substrate P supported by the substrate support member 31; and a detection device 33 for detecting the mark pattern MP provided on the substrate P. The control device 30 includes the computer system. The mounting head 32 includes a nozzle 34 for releasably holding the electronic component C. The detection device 33 includes an imaging device that acquires an image of the mark pattern MP. The detection device 33 includes an optical system and an image sensor. The image sensor includes a couple charged device (CCD) image sensor or a complementary metal oxide semiconductor (CMOS) image sensor.

Substrate

Figure 3:
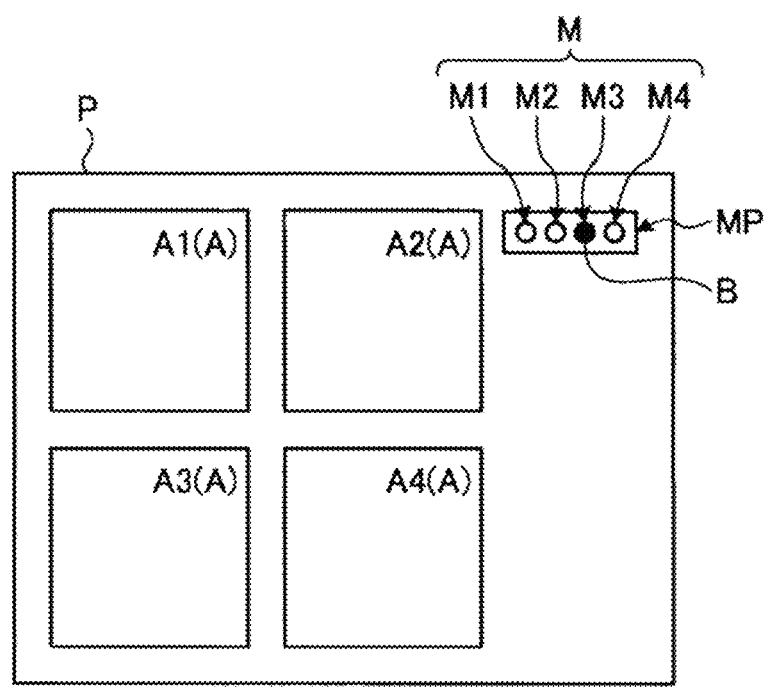
FIG. 3 is a diagram illustrating a substrate according to the embodiment.

FIG. 3 is a diagram illustrating the substrate P according to the embodiment. The substrate P includes a plurality of mounting areas A that define a split substrate. In the embodiment, the mounting area A includes a first mounting area A1, a second mounting area A2, a third mounting area A3, and a fourth mounting area A4.

The split substrate refers to a plurality of split substrates after the single substrate P on which the electronic component C is mounted is split. A plurality of electronic devices including the divided substrate are produced by dividing the substrate P. One split substrate includes one mounting area A. The electronic device is generated in the mounting area A by mounting the electronic component C in each of the plurality of mounting areas A of the substrate P. After the electronic component C is mounted in each of the plurality of mounting areas A of the substrate P, a plurality of electronic devices including the divided substrate are produced by dividing the substrate P so that the plurality of mounting areas A are separated. In the embodiment, four mounting areas A are defined on the substrate P. Four split substrates are generated from the substrate P.

The printing machine prints the cream solder on each of the plurality of mounting areas A. The inspection device 2 inspects the respective printed states of the plurality of mounting areas A before the electronic component C is mounted. The inspection device 2 provides the mark pattern MP to the substrate P based upon the inspection result of the printed state of the mounting area A.

The mark pattern MP indicates a pattern of a mark B to be provided to the substrate P. The mark pattern MP includes a mark area M to which the mark B is provided. The mark area M includes: a first mark area M1 to which the mark B indicating a printed state of the first mounting area A1 is provided; a second mark area M2 to which the mark B indicating a printed state of the second mounting area A2 is provided; a third mark area M3 to which the mark B indicating a printed state of the third mounting area A3 is provided; and a fourth mark area M4 to which the mark B indicating a printed state of the fourth mounting area A4 is provided. In the embodiment, the mark pattern MP is set at a corner of the substrate P outside the mounting area A. The first mark area M1, the second mark area M2, the third mark area M3, and the fourth mark area M4 are defined in a predetermined direction parallel to the surface of the substrate P.

The mark B includes a bad mark indicating that the printed state of the mounting area A is defective. The inspection device 2 inspects the respective printed states of the plurality of mounting areas A provided on the substrate P, and provides the mark pattern MP to the substrate P.

When the respective printed states of the first mounting area A1, the second mounting area A2, the third mounting area A3, and the fourth mounting area A4 are good, the mark B is not provided thereto. When the printed state of the first mounting area A1 is defective, the inspection device 2 provides the mark B to the first mark area M1. When the printed state of the second mounting area A2 is defective, the inspection device 2 provides the mark B to the second mark area M2. When the printed state of the third mounting area A3 is defective, the inspection device 2 provides the mark B to the third mark area M3. When the printed state of the fourth mounting area A4 is defective, the inspection device 2 provides the mark B to the fourth mark area M4.

FIG. 3 illustrates, as an example, the mark pattern MP in which the respective printed states of the first mounting area A1, the second mounting area A2, and the fourth mounting area A4 are good and the printed state of the third mounting area A3 is defective.

Management Device

Figure 4:
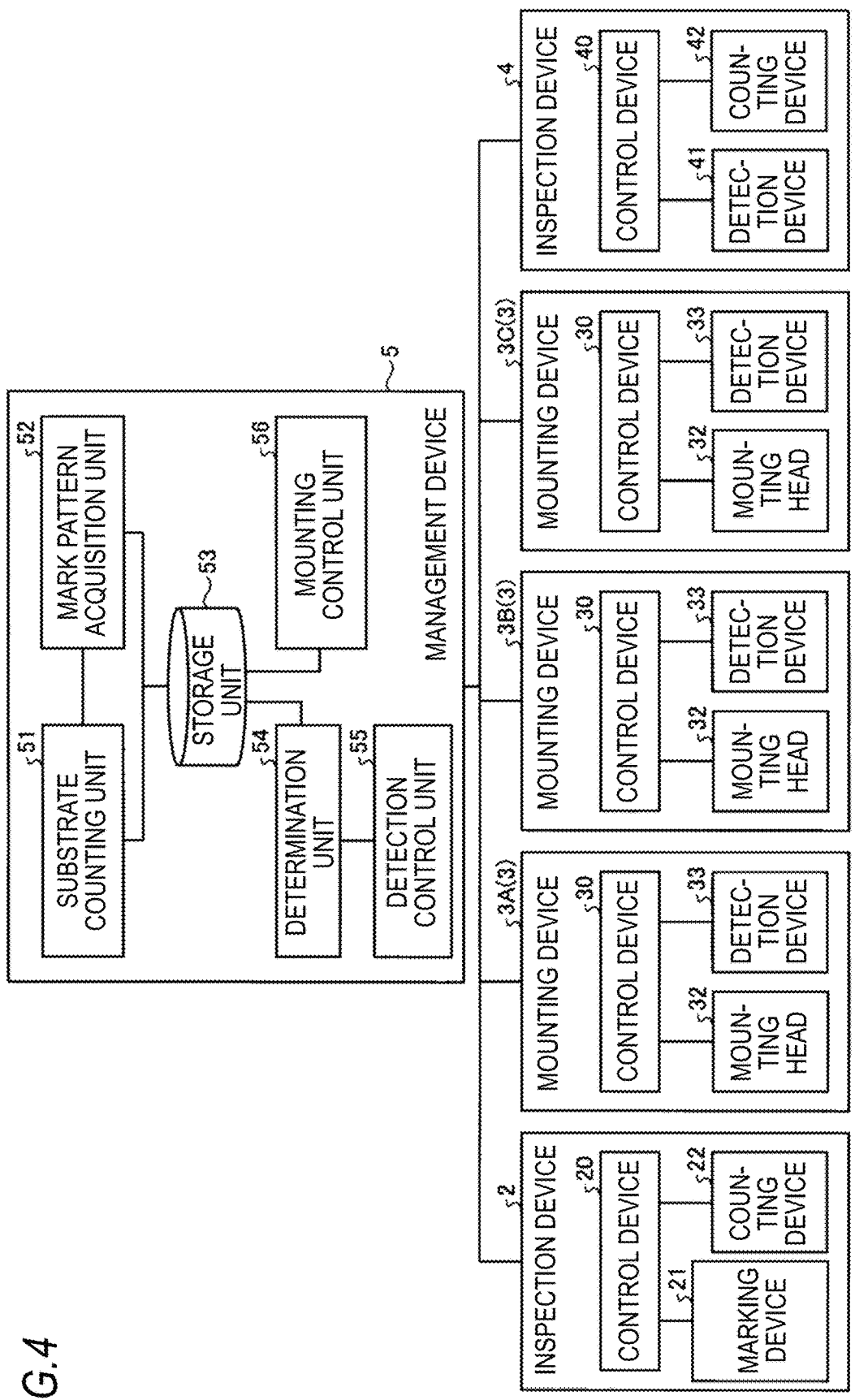
FIG. 4 is a block diagram illustrating the production system.

FIG. 4 is a block diagram illustrating the production system 1 according to the embodiment. As illustrated in FIG. 4, the inspection device 2 includes a control device 20, a marking device 21, and a counting device 22. The mounting device 3 includes a control device 30, a mounting head 32, and a detection device 33. The inspection device 4 includes a control device 40, a detection device 41, and a counting device 42.

The marking device 21 provides the mark B to the substrate P based upon the inspection result of the printed state of the mounting area A before the electronic component C is mounted. When the printed state of the first mounting area A1 is defective, the marking device 21 provides the mark B to the first mark area M1. When the printed state of the second mounting area A2 is defective, the marking device 21 provides the mark B to the second mark area M2. When the printed state of the third mounting area A3 is defective, the marking device 21 provides the mark B to the third mark area M3. When the printed state of the fourth mounting area A4 is defective, the marking device 21 provides the mark B to the fourth mark area B4.

The counting device 22 counts the number of the substrates P carried into the production line 6. The control device 20 outputs data on the number of the substrates P counted by the counting device 22 to the management device 5.

The detection device 33 acquires an image of the mask pattern MP provided on the substrate P. The control device 30 outputs image data of the mask pattern MP acquired by the detection device 33 to the management device 5.

The detection device 41 includes an imaging device that acquires the image of the mask pattern MP provided on the substrate P. The detection device 41 includes an optical system and an image sensor. The control device 40 outputs image data of the mask pattern MP acquired by the detection device 41 to the management device 5.

The counting device 42 counts the number of the substrates P carried out from the production line 6. The control device 40 outputs data on the number of the substrates P counted by the counting device 42 to the management device 5.

The management device 5 includes a substrate counter 51, a mark pattern acquisition unit 52, a storage unit 53, a determination unit 54, a detection controller 55, and a mounting controller 56.

The substrate counter 51 counts the number of the substrates P existing in the production line 6. The number of the substrates P carried into the production line 6 is counted by the counting device 22. The number of the substrates P carried out from the production line 6 is counted by the counting device 42. The substrate counter 51 can count the number of the substrates P existing in the production line 6 based upon on the data on the number of the substrates P counted by the counting device 22 and the data on the number of the substrates P counted by the counting device 42.

The mark pattern acquisition unit 52 acquires the mark pattern MP indicating the pattern of the mark B provided to each of the plurality of substrates P counted by the substrate counter 51. That is, the mark pattern acquisition unit 52 acquires the mark pattern MP indicating the pattern of the mark B provided to each of the plurality of substrates P existing in the production line 6.

The mark pattern MP is provided by the marking device 21 of the inspection device 2. The mark pattern acquisition unit 52 is carried into the inspection device 2 serving as the leading device of the production line 6, and the mark pattern MP provided to the substrate P by the marking device 21 is acquired from the inspection device 2.

The storage unit 53 stores the number of the substrates P existing in the production line 6 counted by the substrate counter 51. The storage unit 53 stores the mark pattern MP acquired by the mark pattern acquisition unit 52 and provided to each of the plurality of substrates P existing in the production line 6.

The determination unit 54 determines whether the respective mark patterns MP of the plurality of substrates P acquired by the mark pattern acquisition unit 52 and stored in the storage unit 53 are the same as each other. That is, the determination unit 54 determines whether the respective mark patterns MP of the plurality of substrates P existing in the production line 6 are the same as each other.

The detection controller 55 controls a detection process of the mark pattern MP by the detection device 33 of the mounting device 3 (3A, 3B, and 3C) based upon a determination result of the determination unit 54. The detection controller 55 controls the detection process by the detection device 33 of the mounting device 3 after the inspection device 2.

When the determination unit 54 determines that the mark patterns MP of the plurality of substrates P existing in the production line 6 are the same as each other, the detection controller 55 outputs an omission command for omitting the detection of the mark pattern MP by the detection device 33 to the mounting device 3. When the determination unit 54 determines that the mark patterns MP of the plurality of substrates P existing in the production line 6 are different from each other, the detection controller 55 outputs an execution command for causing the detection device 33 to execute the detection of at least a part of the mark patterns MP.

For example, when the state of providing the mark B to each of the first mark areas M1 of the plurality of substrates P existing in the production line 6 is the same, the detection controller 55 outputs the omission command for omitting the detection of the first mark area M1 by the detection device 33 to the mounting device 3. For example, when the state of providing the mark B to each of the second mark areas M2 of the plurality of substrates P existing in the production line 6 is different, the detection controller 55 outputs the execution instruction for causing the detection device 33 to execute the detection of the second mark area M2 to the mounting device 3.

The mounting control unit 56 controls the mounting device 3 based upon each of the mark patterns MP of the plurality of substrates P acquired by the mark pattern acquisition unit 52 and stored in the storage unit 53. The mounting control unit 56 controls the mounting device 3 so that the electronic component C is mounted in the mounting area A to which the mark B is not provided. The mounting control unit 56 controls the mounting device 3 so that the electronic component C is not mounted in the mounting area A to which the mark B is provided.

For example, as illustrated in FIG. 3, when the mark B is not provided to each of the first mark area M1 corresponding to the first mounting area A1, the second mark area M2 corresponding to the second mounting area A2, and the fourth mark area M4 corresponding to the fourth mark area M4, the mounting control unit 56 controls the mounting device 3 so that the electronic component C is mounted in each of the first mounting area A1, the second mounting area A2, and the fourth mounting area A4. When the mark B is provided to the third mark area M3 corresponding to the third mounting area A3, the mounting control unit 56 controls the mounting device 3 so that the electronic component C is not mounted in the third mounting area A3.

Operation of Production System

FIGS. 5A to 5D are diagrams illustrating the operation of the production system 1 according to the embodiment. In the following description, it is assumed that the substrate P exists in each of the inspection device 2, the mounting device 3A, the mounting device 3B, the mounting device 3C, and the inspection device 4. FIGS. 5A to 5D schematically illustrate the mark pattern MP provided to the substrate P existing in each of the inspection device 2, the mounting device 3A, the mounting device 3B, the mounting device 3C, and the inspection device 4.

In an example illustrated in FIG. 5A, the mark B is not provided to the first mark area M1 of the substrate P existing in each of the inspection device 2, the mounting device 3A, the mounting device 3B, the mounting device 3C, and the inspection device 4. That is, the state of providing the mark B to each of the first mark areas M1 of the plurality of substrates P existing in the production line 6 is the same.

In the example illustrated in FIG. 5A, the mark B is not provided to the second mark area M2 of the substrate P existing in each of the inspection device 2, the mounting device 3A, the mounting device 3B, the mounting device 3C, and the inspection device 4. That is, the state of providing the mark B to each of the second mark areas M2 of the plurality of substrates P existing in the production line 6 is the same.

In the example illustrated in FIG. 5A, the mark B is not provided to the third mark area M3 of the substrate P existing in each of the inspection device 2, the mounting device 3A, the mounting device 3B, the mounting device 3C, and the inspection device 4. That is, the state of providing the mark B to each of the third mark areas M3 of the plurality of substrates P existing in the production line 6 is the same.

In the example illustrated in FIG. 5A, the mark B is not provided to the fourth mark area M4 of the substrate P existing in each of the inspection device 2, the mounting device 3A, the mounting device 3B, the mounting device 3C, and the inspection device 4. That is, the state of providing the mark B to each of the fourth mark areas M4 of the plurality of substrates P existing in the production line 6 is the same.

In the example illustrated in FIG. 5A, the detection of the mark pattern MP by the detection device 33 of the mounting device 3 (3A, 3B, and 3C) is not executed. In the example illustrated in FIG. 5A, after the substrate P is carried into the mounting device 3, the mounting device 3 starts to mount the electronic component C on the substrate P without executing the detection of the mark pattern MP by the detection device 33. The mark B is not provided to each of the first mark area M1, the second mark area M2, the third mark area M3, and the fourth mark area M4. Therefore, the mounting device 3 mounts the electronic component C in each of the first mounting area A1, the second mounting area A2, the third mounting area A3, and the fourth mounting area A4.

In the example illustrated in FIG. 5B, the mark B is not provided to the first mark area M1 of the substrate P existing in each of the inspection device 2, the mounting device 3A, the mounting device 3B, the mounting device 3C, and the inspection device 4. That is, the state of providing the mark B to each of the first mark areas M1 of the plurality of substrates P existing in the production line 6 is the same.

In the example illustrated in FIG. 5B, the mark B is not provided to the second mark area M2 of the substrate P existing in each of the inspection device 2, the mounting device 3A, the mounting device 3B, the mounting device 3C, and the inspection device 4. That is, the state of providing the mark B to each of the second mark areas M2 of the plurality of substrates P existing in the production line 6 is the same.

In the example illustrated in FIG. 5B, the mark B is provided to the third mark area M3 of the substrate P existing in each of the inspection device 2, the mounting device 3A, the mounting device 3B, the mounting device 3C, and the inspection device 4. That is, the state of providing the mark B to each of the third mark areas M3 of the plurality of substrates P existing in the production line 6 is the same.

In the example illustrated in FIG. 5B, the mark B is not provided to the fourth mark area M4 of the substrate P existing in each of the inspection device 2, the mounting device 3A, the mounting device 3B, the mounting device 3C, and the inspection device 4. That is, the state of providing the mark B to each of the fourth mark areas M4 of the plurality of substrates P existing in the production line 6 is the same.

In the example illustrated in FIG. 5B, the detection of the mark pattern MP by the detection device 33 of the mounting device 3 (3A, 3B, and 3C) is not executed. In the example illustrated in FIG. 5B, after the substrate P is carried into the mounting device 3, the mounting device 3 starts to mount the electronic component C on the substrate P without executing the detection of the mark pattern MP by the detection device 33. The mark B is not provided to each of the first mark area M1, the second mark area M2, and the fourth mark area M4. Therefore, the mounting device 3 mounts the electronic component C in each of the first mounting area A1, the second mounting area A2, and the fourth mounting area A4. The mark B is provided to the third mark area M3. Therefore, the mounting device 3 does not mount the electronic component C in the third mounting area A3.

In the example illustrated in FIG. 5C, the mark B is not provided to the first mark area M1 of the substrate P existing in each of the inspection device 2, the mounting device 3A, the mounting device 3B, the mounting device 3C, and the inspection device 4. That is, the state of providing the mark B to each of the first mark areas M1 of the plurality of substrates P existing in the production line 6 is the same.

In the example illustrated in FIG. 5C, the mark B is not provided to the second mark area M2 of the substrate P existing in each of the mounting devices 3A, 3B, and 3C, and the inspection device 4. On the other hand, the mark B is provided to the second mark area M2 of the substrate P existing in the inspection device 2. That is, the state of providing the mark B to each of the second mark areas M2 of the plurality of substrates P existing in the production line 6 is different.

In the example illustrated in FIG. 5C, the mark B is provided to the third mark area M3 of the substrate P existing in each of the inspection device 2, the mounting device 3A, the mounting device 3B, the mounting device 3C, and the inspection device 4. That is, the state of providing the mark B to each of the third mark areas M3 of the plurality of substrates P existing in the production line 6 is the same.

In the example illustrated in FIG. 5C, the mark B is not provided to the fourth mark area M4 of the substrate P existing in each of the inspection device 2, the mounting device 3A, the mounting device 3B, the mounting device 3C, and the inspection device 4. That is, the state of providing the mark B to each of the fourth mark areas M4 of the plurality of substrates P existing in the production line 6 is the same.

In the example illustrated in FIG. 5C, in the mounting device 3 (3A, 3B, and 3C), the detection device 33 executes the detection of the second mark area M2 in which the state of providing the mark B is different among the mark patterns MP. On the other hand, the detection of the first mark area M1, the third mark area M3, and the fourth mark area M4 in which the state of providing the mark B is the same is not executed. In the example illustrated in FIG. 5C, after the substrate P is carried into the mounting device 3, the mounting device 3 executes the detection of the second mark area M2 by the detection device 33. After executing the detection of the second mark area M2, the mounting device 3 starts to mount the electronic component C on the substrate P. When the mark B is provided to the second mark area M2, the mounting device 3 does not mount the electronic component C in the second mounting area A2. When the mark B is not provided to the second mark area M2, the mounting device 3 mounts the electronic component C in the second mounting area A2. The mark B is not provided to each of the first mark area M1 and the fourth mark area M4. Therefore, the mounting device 3 mounts the electronic components C in each of the first mounting area A1 and the fourth mounting area A4. The mark B is provided to the third mark area M3. Therefore, the mounting device 3 does not mount the electronic component C in the third mounting area A3.

That is, as illustrated in FIG. 5C, when the substrate P in which the state of providing the mark B is different is carried into the production line 6, the detection control unit 55 performs control so that the second mark area M2 in which the state of providing the mark B is different is detected in all the mounting devices 3.

In the example illustrated in FIG. 5D, the mark B is not provided to the first mark area M1 of the substrate P existing in each of the inspection device 2, the mounting device 3A, the mounting device 3B, the mounting device 3C, and the inspection device 4. That is, the state of providing the mark B to each of the first mark areas M1 of the plurality of substrates P existing in the production line 6 is the same.

In the example illustrated in FIG. 5D, the mark B is not provided to the second mark area M2 of the substrate P existing in each of the inspection device 2, the mounting device 3A, the mounting device 3B, the mounting device 3C, and the inspection device 4. That is, the state of providing the mark B to each of the second mark areas M2 of the plurality of substrates P existing in the production line 6 is the same.

In the example illustrated in FIG. 5D, the mark B is provided to the third mark area M3 of the substrate P existing in each of the inspection device 2, the mounting device 3A, the mounting device 3B, the mounting device 3C, and the inspection device 4. That is, the state of providing the mark B to each of the third mark areas M3 of the plurality of substrates P existing in the production line 6 is the same.

In the example illustrated in FIG. 5D, the mark B is not provided to the fourth mark area M4 of the substrate P existing in each of the mounting devices 3A, 3B, and 3C, and the inspection device 4. On the other hand, the mark B is provided to the fourth mark area M4 of the substrate P existing in the inspection device 2. That is, the state of providing the mark B to each of the fourth mark areas M4 of the plurality of substrates P existing in the production line 6 is different.

In the example illustrated in FIG. 5D, in the mounting device 3 (3A, 3B, and 3C), the detection device 33 executes the detection of the fourth mark area M4 in which the state of providing the mark B is different among the mark patterns MP. On the other hand, the detection of the first mark area M1, the second mark area M2, and the third mark area M3 in which the state of providing the mark B is the same is not executed. In the example illustrated in FIG. 5D, after the substrate P is carried into the mounting device 3, the mounting device 3 executes the detection of the fourth mark area M4 by the detection device 33. After executing the detection of the fourth mark area M4, the mounting device 3 starts to mount the electronic component C on the substrate P. When the mark B is provided to the fourth mark area M4, the mounting device 3 does not mount the electronic component C in the fourth mounting area A4. When the mark B is not provided to the fourth mark area M4, the mounting device 3 mounts the electronic component C in the fourth mounting area A4. The mark B is not provided to each of the first mark area M1 and the second mark area M2. Therefore, the mounting device 3 mounts the electronic component C in each of the first mounting area A1 and the second mounting area A2. The mark B is provided to the third mark area M3. Therefore, the mounting device 3 does not mount the electronic component C in the third mounting area A3.

That is, as illustrated in FIG. 5D, when the substrate P in which the state of providing the mark B is different is carried into the production line 6, the detection control unit 55 performs control so that the fourth mark area M4 in which the state of providing the mark B is different is detected in all the mounting devices 3.

Production Method

Figure 6:
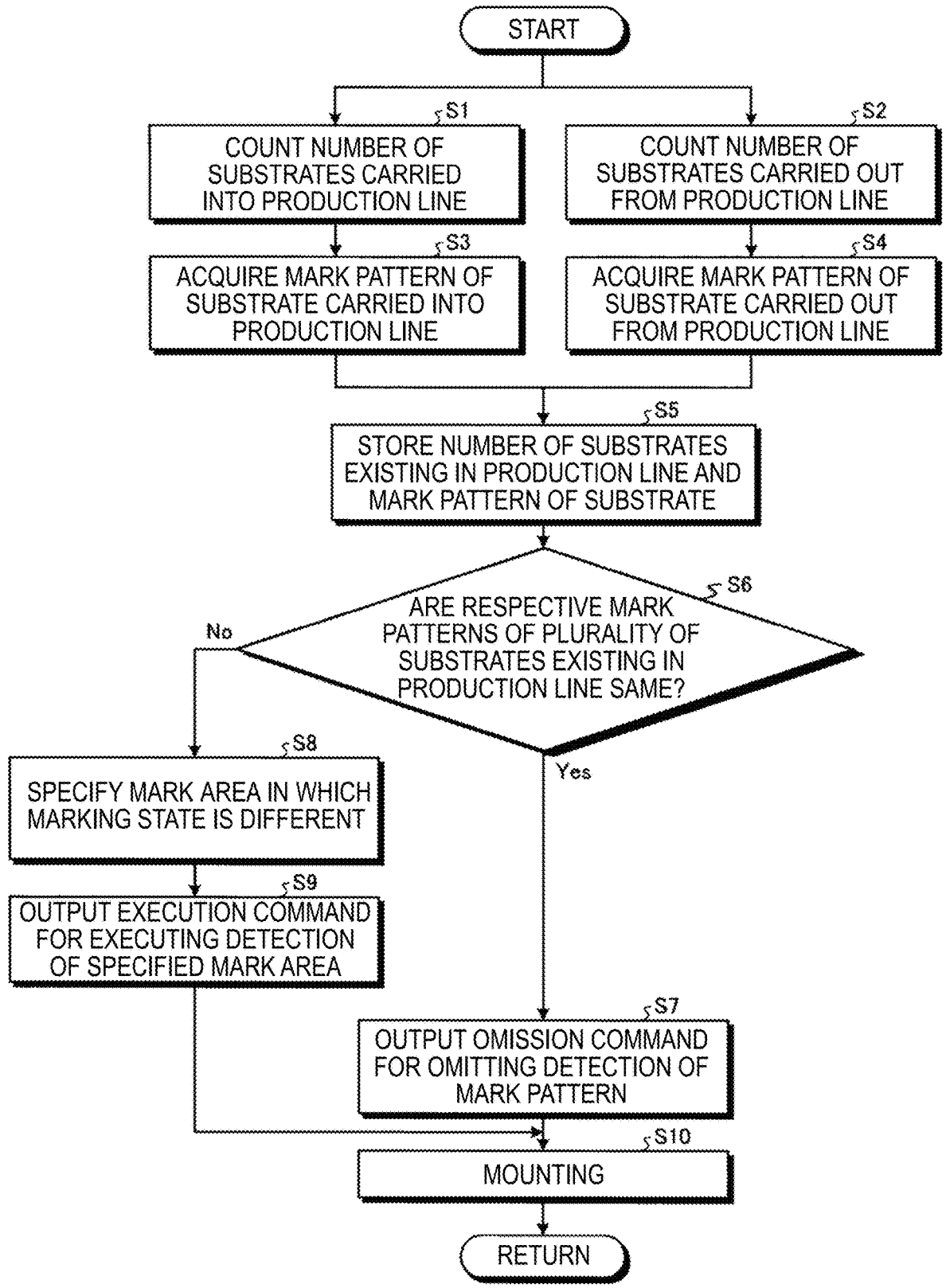
FIG. 6 is a flowchart illustrating a production method according to the embodiment.

FIG. 6 is a flowchart illustrating a production method according to the embodiment. The number of the substrates P carried into the production line 6 is counted by the counting device 22 of the inspection device 2. The substrate counter 51 acquires data on the number of the substrates P counted by the counting device 22, and counts the number of the substrates P carried into the production line 6 (Step S1).

The number of the substrates P carried out from the production line 6 is counted by the counting device 42 of the inspection device 4. The substrate counter 51 acquires data on the number of the substrates P counted by the counting device 42, and counts the number of the substrates P carried out from the production line 6 (Step S2).

The marking device 21 of the inspection device 2 provides the mark pattern MP to the substrate P carried into the production line 6 based upon an inspection result of the printed state of the mounting area A. The mark pattern acquisition unit 52 acquires the mark pattern MP provided to the substrate P carried into the production line 6 from the inspection device 2 (Step S3).

The detection device 41 of the inspection device 4 detects the mark pattern MP provided to the substrate P carried out from the production line 6. The mark pattern acquisition unit 52 acquires the mark pattern MP provided to the substrate P carried out from the production line 6 from the inspection device 4 (Step S4).

The substrate counter 51 can count the number of the substrates P existing in the production line 6 based upon the data on the number of the substrates P counted by the counting device 22 and the data on the number of the substrates P counted by the counting device 42.

The mark pattern acquisition unit 52 can acquire the mark pattern MP provided to each of the plurality of substrates P existing in the production line 6 based upon the mark pattern MP provided to the substrate P carried into the production line 6 and the mark pattern MP provided to the substrate P carried out from the production line 6.

The storage unit 53 stores the number of the substrates P existing in the production line 6 counted by the substrate counter 51. The storage unit 53 stores the mark pattern MP acquired by the mark pattern acquisition unit 52 and provided to each of the plurality of substrates P existing in the production line 6 (Step S5).

The determination unit 54 determines whether the respective mark patterns MP of the plurality of substrates P acquired by the mark pattern acquisition unit 52 and stored in the storage unit 53 are the same as each other. That is, the determination unit 54 determines whether the respective mark patterns MP provided to the plurality of substrates P existing in the production line 6 are the same as each other (Step S6).

In step S6, when it is determined that the respective mark patterns MP provided to the plurality of substrates P existing in the production line 6 are the same as each other (Step S6: Yes), the detection control unit 55 outputs the omission command for omitting the detection of the mark pattern MP by the detection device 33 to each of the plurality of mounting devices 3 (Step S7).

In step S6, when it is determined that the respective mark patterns MP provided to the plurality of substrates P existing in the production line 6 are different from each other (Step S6: No), the detection control unit 55 specifies the mark area M in which the state of providing the mark B is different among the plurality of mark areas M of the mark pattern MP (step S8).

The detection control unit 55 outputs the execution command for causing the detection device 33 to execute the detection of the mark area M in which the state of providing the mark B is different, which is specified in step S8, to each of the plurality of mounting devices 3 (step S9).

As described with reference to FIG. 5C, when the state of providing the mark B to the second mark area M2 is different, the detection control unit 55 outputs the execution command to each of the plurality of mounting devices 3 so that the detection of the second mark area M2 by the detection device 33 is executed. As described with reference to FIG. 5D, when the state of providing the mark B to the fourth mark area M4 is different, the detection control unit 55 outputs the execution command to each of the plurality of mounting devices 3 so that the detection of the fourth mark area M4 by the detection device 33 is executed.

The mounting control unit 56 controls the mounting head 32 of the mounting device 3 based upon the mark pattern MP (Step S10).

As described with reference to FIG. 5C, when it is determined that the mark B is provided to the second mark area M2 based upon the detection result of the detection device 33, the mounting device 3 does not mount the electronic component C in the second mounting area A2. When it is determined that the mark B is not provided to the second mark area M2 based upon the detection result of the detection device 33, the mounting device 3 mounts the electronic component C in the second mounting area A2. As described with reference to FIG. 5D, when it is determined that the mark B is provided to the fourth mark area M4 based upon the detection result of the detection device 33, the mounting device 3 does not mount the electronic component C in the fourth mounting area A4. When it is determined that the mark B is not provided to the fourth mark area M4 based upon the detection result of the detection device 33, the mounting device 3 mounts the electronic component C in the fourth mounting area A4.

With respect to the mounting area A corresponding to the mark area M in which the state of providing the mark B is the same, the mounting control unit 56 controls the mounting head 32 based upon the mark pattern MP stored in the storage unit 53.

As described with reference to FIG. 5C, the detection device 33 does not execute the detection of the first mark area M1, the third mark area M3, and the fourth mark area M4 in which the state of providing the mark B is the same, and the mounting device 3 mounts the electronic component C on the substrate P based upon the mark pattern MP stored in the storage unit 53. When it is stored in the storage unit 53 that the mark B is not provided to each of the first mark area M1 and the fourth mark area M4, the mounting device 3 mounts the electronic component C in each of the first mounting area A1 and the fourth mounting area A4 based upon the data stored in the storage unit 53 without executing the detection by the detection device 33. When it is stored in the storage unit 53 that the mark B is provided to the third mark area M3, the mounting device 3 does not mount the electronic component C in the third mounting area A3 based upon the data stored in the storage unit 53 without executing the detection by the detection device 33. As described with reference to FIG. 5D, the detection device 33 does not execute the detection of the first mark area M1, the second mark area M2, and the third mark area M3 in which the state of providing the mark B is the same, the mounting device 3 mounts the electronic component C on the substrate P based upon the mark pattern MP stored in the storage unit 53. When it is stored in the storage unit 53 that the mark B is not provided to each of the first mark area M1 and the second mark area M2, the mounting device 3 mounts the electronic component C in each of the first mounting area A1 and the second mounting area A2 based upon the data stored in the storage unit 53 without executing the detection by the detection device 33. When it is stored in the storage unit 53 that the mark B is provided to the third mark area M3, the mounting device 3 does not mount the electronic component C in the third mounting area A3 based upon the data stored in the storage unit 53 without executing the detection by the detection device 33.

Computer System

Figure 7:
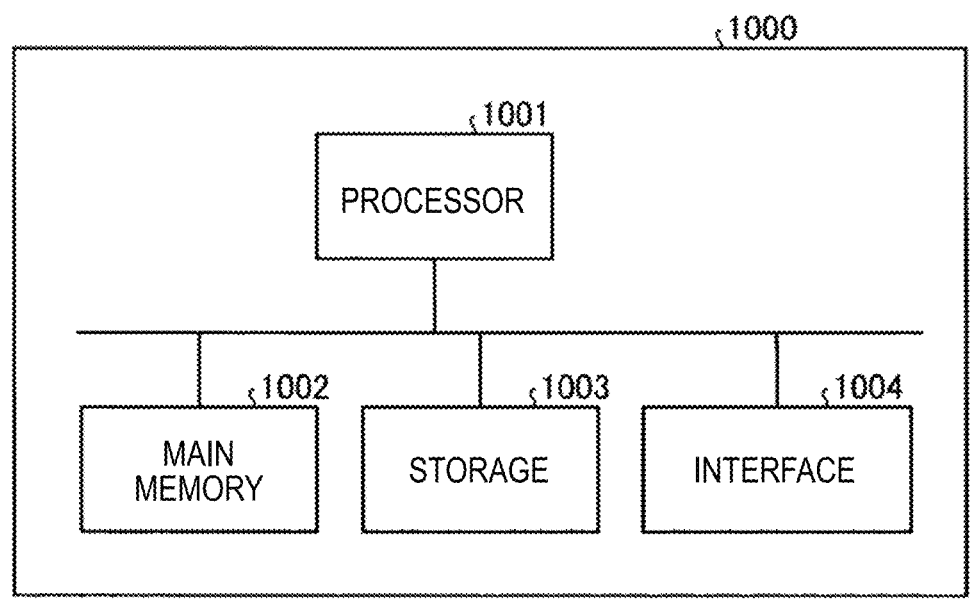
FIG. 7 is a block diagram illustrating a computer system according to the embodiment.

FIG. 7 is a block diagram illustrating a computer system 1000 according to the embodiment. Each of the management device 5, the control device 20, the control device 30, and the control device 40 includes the computer system 1000. The computer system 1000 includes: a processor 1001 such as a central processing unit (CPU); a main memory 1002 including a nonvolatile memory such as a read only memory (ROM) and a volatile memory such as a random access memory (RAM); a storage 1003; and an interface 1004 including an input and output circuit. The respective functions of the management device 5, the control device 20, the control device 30, and the control device 40 are stored in the storage 1003 as a program. The processor 1001 reads the program from the storage 1003, loads the program in the main memory 1002, and executes the above-described process according to the program. The program may be distributed to the computer system 1000 via a network.

According to the above-described embodiment, the program can cause the program system 1000 to count the number of the substrates P existing in the production line 6 including the mounting device 3, to acquire the mark pattern MP indicating the pattern of the mark B provided to each of the plurality of counted substrates P, to determine whether the respective acquired mark patterns MP of the plurality of substrates are the same as each other, and to control the detection process of the mark pattern MP by the mounting device 3 based upon the determination result.

Effect

As described above, the number of the substrates P existing in the production line 6 is counted, the mark pattern MP provided to each of the plurality of counted substrates P is acquired, and it is determined whether the respective mark patterns MP of the plurality of substrates P existing in the production line 6 are the same as each other. When the respective mark patterns MP of the plurality of substrates P existing in the production line 6 are the same as each other, the plurality of mounting devices 3 can mount the electronic component C in the mounting area A to which the mark B is not provided, based upon the mark pattern MP provided by the inspection device 2 serving as the leading device. The plurality of mounting devices 3 can recognize the printed state of the mounting area A based upon the mark pattern MP provided by the inspection device 2 without individually detecting the mark B. Only when it is determined that the respective mark patterns MP of the plurality of substrates P existing in the production line 6 are different from each other, the mounting device 3 may execute the detection of the mark pattern MP by the detection device 33. Since the detection of the mark B is not unnecessarily executed, deterioration in the productivity of the electronic device by the production system 1 is prevented.

When it is determined that the respective mark patterns MP provided to the plurality of substrates P existing in the production line 6 are different from each other, the mark area M in which the state of providing the mark B is different is specified among the plurality of mark areas M of the mark pattern MP. The mounting device 3 may detect only the mark area M in which the state of providing the mark B is different by using the detection device 33. Since the detection of the mark B is not unnecessarily executed, the deterioration in the productivity of the electronic device by the production system 1 is prevented.

According to the embodiment, even when the order of the substrates P to be processed in the production line 6 is changed, the substrate P is removed in the middle of the production line 6, and the substrate P is inserted into the production line 6 in the middle of the production line 6, the number of the substrates P existing in the production line 6 is managed and the mark pattern MP provided to each of the plurality of substrates P existing in the production line 6 is managed, whereby the unnecessary detection of the mark B by the detection device 33 of the mounting device 3 is prevented, and thus the deterioration in the productivity of the electronic device is prevented.

Other Embodiments

In the above-described embodiment, the leading device of the production line 6 is the inspection device 2 that inspects the printed state of the substrate P and provides the mark pattern MP to the substrate P. The leading device of the production line 6 may be the mounting device 3 including the detection device 33 for detecting the mark pattern MP provided to the substrate P by the inspection device 2. The mark pattern acquisition unit 52 can acquire the mark pattern MP of the substrate P, which is carried into the mounting device 3 serving as the leading device of the production line 6 and detected by the detection device 33, from the mounting device 3 serving as the leading device. The detection control unit 55 can control the detection process of the mark pattern MP by the detection device 33 of the mounting device 3 after the mounting device 3 serving as the leading device.

In the above-described embodiment, a plurality of mounting areas A are defined on the substrate P, and the substrate P is divided into a plurality of split substrates. The substrate P may not be divided into a plurality of split substrates.

In the above-described embodiment, the mark B is a mark indicating the printed state of the substrate P. The mark B may be a mark indicating a quality state of the substrate P, and is not limited to the mark indicating the printed state.

What is claimed is:

1. A production system, comprising:
    a substrate counter configured to count the number of substrates existing in a production line including a mounting device;
    a mark pattern acquisition unit configured to acquire a mark pattern indicating a pattern of a mark that is provided to each of the plurality of substrates counted by the substrate counter, the mark pattern includes a first mark area to which a mark indicating a state of a first mounting area, and a second mark area to which a mark indicating a state of a second mounting area;
    a determination unit configured to determine whether the respective mark patterns of the plurality of substrates acquired by the mark pattern acquisition unit are the same as each other; and
    a detection controller configured to control a detection process of the mark pattern by the mounting device based upon a determination result of the determination unit, the detection controller omits detection of the mark pattern when it is determined that the mark patterns are the same as each other, the detection controller executes detection of at least a part of the mark patterns when it is determined that the mark patterns are different from each other, and the detection controller omits detection of the first mark area and executes detection of the second mark area when a state of providing the mark to the first mark area of each of the plurality of substrates is the same, and a state of providing the mark to the second mark area thereof is different.

2. The production system according to claim 1, wherein the mark pattern acquisition unit acquires the mark pattern of the substrate carried into a leading device of the production line from the leading device, and
    the detection controller controls the detection process by the mounting device after the leading device.

3. The production system according to claim 2, wherein the leading device is an inspection device that inspects a state of the substrate and provides the mark pattern to the substrate or the mounting device that detects the mark pattern provided to the substrate.

4. The production system according to claim 1, wherein the substrate includes a plurality of mounting areas that define a split substrate,
    and the plurality of mounting areas including the first mounting area and the second mounting area.

5. The production system according to claim 4, further comprising:
    a mounting controller configured to control the mounding mounting device based upon the mark pattern.

6. The production system according to claim 5, wherein the mark includes a bad mark indicating that the state of the mounting area is defective, and
    the mounting controller controls the mounting device so that an electronic component is not mounted in the mounting area to which the bad mark is provided.

7. A production method, comprising:
    counting the number of substrates existing in a production line including a mounting device;
    acquiring a mark pattern indicating a pattern of a mark that is provided to each of the plurality of counted substrates, the mark pattern includes a first mark area to which a mark indicating a state of a first mounting area is provided, and a second mark area to which a mark indicating a state of a second mounting area is provided;
    determining whether the respective acquired mark patterns of the plurality of substrates are the same as each other;
    controlling a detection process of the mark pattern by the mounting device based upon a determination result;
    omitting detection of the mark pattern when it is determined that the mark patterns are the same as each other;
    executing detection of at least a part of the mark patterns when it is determined that the mark patterns are different from each other; and
    omitting detection of the first mark area and executes detection of the second mark area when a state of providing the mark to the first mark area of each of the plurality of substrates is the same, and a state of providing the mark to the second mark area thereof is different.

* * * * *